United States Patent
Grosjean et al.

(10) Patent No.: US 9,448,266 B2
(45) Date of Patent: Sep. 20, 2016

(54) METHOD OF MEASURING A PHYSICAL PARAMETER AND ELECTRONIC INTERFACE CIRCUIT FOR A CAPACITIVE SENSOR FOR IMPLEMENTING THE SAME

(71) Applicant: EM MICROELECTRONIC-MARIN SA, Marin (CH)

(72) Inventors: Sylvain Grosjean, Les Fins (FR); Christophe Entringer, Corcelles-pres-Concise (CH)

(73) Assignee: EM MICROELECTRONIC-MARIN SA, Marin (CH)

( * ) Notice: Subject to any disclaimer, the term of this patent is extended or adjusted under 35 U.S.C. 154(b) by 873 days.

(21) Appl. No.: 13/733,608

(22) Filed: Jan. 3, 2013

(65) Prior Publication Data

US 2013/0191060 A1     Jul. 25, 2013

(30) Foreign Application Priority Data

Jan. 20, 2012   (EP) .................................... 12151949

(51) Int. Cl.
    *G01P 15/125*   (2006.01)
    *G01R 27/26*    (2006.01)
    (Continued)

(52) U.S. Cl.
    CPC ............ *G01R 27/2605* (2013.01); *G01D 5/24* (2013.01); *G01L 5/165* (2013.01); *G01P 15/125* (2013.01)

(58) Field of Classification Search
    CPC ...... G01P 15/125; G01D 5/24; G01D 5/241; G01L 5/165; G01R 27/2605
    USPC ............................................ 702/65; 324/661
    See application file for complete search history.

(56) References Cited

U.S. PATENT DOCUMENTS

2008/0197861 A1\* 8/2008 Grosjean ................ G01D 18/00
                                                         324/661
2009/0241666 A1   10/2009 Gerfers et al.
(Continued)

FOREIGN PATENT DOCUMENTS

EP        1 835 263 A1    7/2006
EP        2 343 507 A1    7/2011
(Continued)

OTHER PUBLICATIONS

H. Leuthold, et al., "An ASIC for High-resolution Capacitive Microaccelerometers", Sensors and Actuators A21-A23, 1990, pp. 278-281.
(Continued)

*Primary Examiner* — Gregory J Toatley
*Assistant Examiner* — Yoshihisa Ishizuka
(74) *Attorney, Agent, or Firm* — Sughrue Mion, PLLC

(57) ABSTRACT

The method is for measuring a physical parameter via an electronic circuit connected to a two differential capacitor sensor having two fixed electrodes and a common moving electrode. The circuit supplies first and second digital measuring signals. Each measuring cycle consists on biasing fixed electrodes by a first biasing and a second biasing reverse of the first biasing, alternated with biasing the electrodes by the measuring voltage based on first and second digital signals. Each conversion starts by a small step value added to or subtracted from each digital signal in each cycle. If the successive identical amplifier output states counted or counted down by a counter is higher than a threshold, a large step value is added to or subtracted from the digital signals in each cycle. Re-adaptation to the small step value occurs when a sign change is detected in the counter, until the conversion end.

11 Claims, 4 Drawing Sheets

(51) Int. Cl.
*G01L 5/16* (2006.01)
*G01D 5/24* (2006.01)

(56) References Cited

U.S. PATENT DOCUMENTS

2010/0231237 A1* 9/2010 Deschildre ............ G01P 15/125
324/661
2011/0154906 A1* 6/2011 Grosjean .................. G01D 5/24
73/771

FOREIGN PATENT DOCUMENTS

WO 2006/070272 A2 7/2006
WO 2008/107737 A1 9/2008

OTHER PUBLICATIONS

Yen S. Yee, et al., "A 1 mV MOS Comparator", IEEE Journal of Solid-State Circuits, Jun. 1978, pp. 294-298, vol. SC-13, No. 3.

* cited by examiner

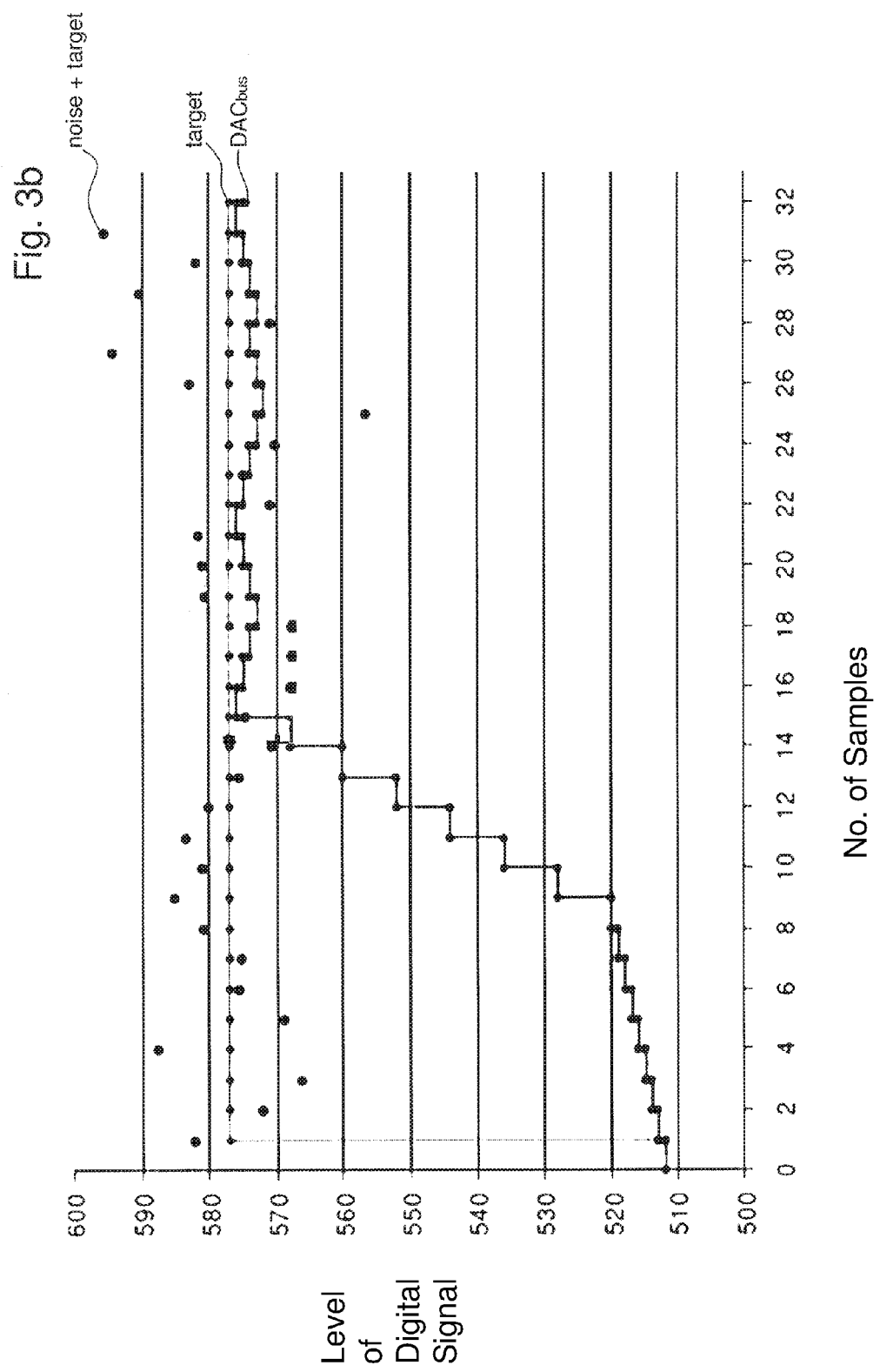

ed Jan. 20, 2012, the entire
METHOD OF MEASURING A PHYSICAL PARAMETER AND ELECTRONIC INTERFACE CIRCUIT FOR A CAPACITIVE SENSOR FOR IMPLEMENTING THE SAME This application claims priority from European Patent Application No. 12151949.0 filed Jan. 20, 2012, the entire disclosure of which is incorporated herein by reference.

FIELD OF THE INVENTION

The invention concerns a method of measuring a physical parameter, such as an acceleration, angular speed, force or pressure, by means of an electronic interface circuit connected to a capacitive sensor.

The invention also concerns an electronic interface circuit for a capacitive sensor for implementing the measuring method. The capacitive sensor is formed of at least two differential connected capacitors. A common electrode of the capacitors is capable of moving between two fixed electrodes under the action, for example, of a force in order to alter the capacitive value of each capacitor.

BACKGROUND OF THE INVENTION

In a simple conventional capacitive sensor design, the common electrode, which is mobile, forms part of an armature resiliently held between the two fixed electrodes. In this case, the capacitive sensor may be capable of performing a measurement along one direction of movement of the moving electrode. At rest, this common moving electrode is normally equidistant from the two fixed electrodes in order to have two capacitors with an equal capacitance value. The common moving electrode can move some distance in the direction of one or other of the fixed electrodes under the action of a force. Thus the capacitive value of each capacitor varies inversely. The electronic interface circuit connected to the capacitive sensor thus enables an analogue output signal to be supplied. This analogue output signal takes the form of a voltage dependent on the capacitance variation of the two capacitors.

This electronic interface circuit for a capacitive sensor is disclosed in the article by Messrs H. Leuthold and F. Rudolph, which appeared in the journal entitled "Sensors and actuators" A21-23 (1990), pages 278 to 281.

The capacitive sensor may be an accelerometer for performing an acceleration measurement in conjunction with an electronic interface circuit. It may be a single axis accelerometer like the aforementioned capacitive sensor, or a multi-axis or tri-axis accelerometer for performing a measurement in three directions X, Y and Z. A tri-axis MEMS accelerometer of this type may include a single mass, i.e. a common inertial mass for the three pairs of differential capacitors, or three masses for the three pairs of capacitors. In the first case, a single common electrode and six fixed electrodes are provided, whereas in the second case, one common electrode with two fixed electrodes is provided for each pair of capacitors.

Both the electronic circuit and the capacitive sensor, such as a MEMS accelerometer, are made in a semiconductor substrate. Consequently, stray capacitances at the electronic circuit input are added to the capacitances of the capacitors of the MEMS capacitive sensor. These stray capacitances do not depend on the motion of the moving electrode, which consequently creates non-linearities and also lowers the sensitivity or gain of the electronic circuit. The same is true with the MEMS capacitive sensor, where the potential of the substrate during operation of the sensor also creates non-linearities. Thus, the measured electrostatic force is not zero in the sensor and electronic circuit in a rest mode. Because of the influence of the substrate potential on the electrostatic force, this leads to a variation in the measured real force, which is applied across the common moving electrode, which is a drawback.

To carry out a force, acceleration or pressure measurement using the electronic circuit, the fixed electrodes of two capacitors or pairs of capacitors are biased or excited cyclically by voltages of opposite polarity relative to an off reference voltage. By biasing or polarizing the two fixed electrodes at different voltage levels, the charge difference across the moving electrode can be measured and converted into at least one electronic circuit output voltage. When the output voltage or voltages are stabilised at their final value, the total charge across the moving electrode becomes zero. Consequently, these output voltages are supplied sampled to a processing circuit.

Since the measurement of a force, acceleration or pressure is dependent on the aforementioned non-linearities and on any offset voltage linked to unmatched electronic components, EP Patent Application No. 1 835 263 proposes a solution to this problem. A symmetrical double structure is proposed in the electronic circuit, particularly with two integrators following the charge transfer amplifier. Each integrator supplies a corresponding analogue output voltage at output according to positive electrode biasing or negative electrode biasing. Because of this, a voltage offset due to technology or to the variation in supply voltage can be minimised or eliminated using the two analogue integrator output voltages. Moreover, the substrate potential is no longer of any importance given that the electronic circuit includes an identical double structure operating in total symmetry.

However, one drawback of this type of electronic circuit of EP Patent Application No. 1 835 263 is that it supplies output signals, such as output voltages, in analogue form. This requires the use of two integrators. This means that it is not possible to sufficiently reduce the size of the integrated components and the electrical power consumption of the integrated electronic circuit. Moreover, the electronic circuit is only arranged to perform a measurement with one capacitive sensor along a single measurement axis.

It is thus preferred to make an electronic circuit which supplies digital measuring signals at output. WO Patent Application No. 2004/113930, which discloses an electronic circuit of this type connected to a single axis or multi-axis capacitive sensor for measuring an acceleration, can be cited in this regard. A logic circuit specific to each measurement axis, which processes digital measuring signals, is provided after the charge transfer amplifier, which is connected to the common moving electrode. The output of each logic circuit supplies a binary measuring signal representative of a measuring voltage level dependent on the movement of the moving electrode relative to the fixed electrodes for each axis in succession. The binary measuring signal for each axis is supplied in succession to a digital-analogue converter. In one phase of each measuring cycle for a selected axis, this converter supplies a measuring voltage to the fixed electrodes alternately with a phase of biasing the fixed electrodes at a high voltage and a low voltage from a supply voltage source. The binary signal obtained at the output of each logic unit is incremented or decremented by one unit at each series of measuring phases, until the total charge across the moving electrode becomes zero. Although the size of the electronic components and the electrical power consumption are reduced, the aforementioned non-linearities and voltage offsets are not removed, which is a drawback. Moreover, the stabilising time of the digital output signal for each measurement axis is relatively long, which is another drawback.

Like the preceding document, WO Patent Application No. 2008/107737 discloses an electronic interface circuit for a measuring acceleration sensor. An analogue measurement signal is stored after a charge transfer amplifier in one phase of a measuring cycle after the fixed electrodes of the capacitor have been biased. The analogue signal is converted into a digital signal stored in a logic unit of the electronic circuit. The stored digital signal is subsequently converted by a digital-analogue converter into an analogue return signal in the form of a voltage, which is applied to all the sensor electrodes in a successive phase of each measuring cycle. In a measuring cycle, the fixed electrodes are biased in succession by a first biasing and a second biasing which is inverse to the first biasing. This enables leakage currents to be removed from the electronic circuit. However, a large number of steps are necessary to obtain a physical parameter measuring signal at output, which is a drawback.

EP Patent Application No. 2 343 507 A1 discloses an electronic interface circuit for a single axis or tri-axis measuring sensor. The measuring signals are digitally processed after the charge transfer amplifier in a logic unit. Following positive biasing and negative biasing digital measuring signals are stored in corresponding registers of the logic unit. A digital-analogue converter is also used for converting, in succession, the digital signals for each axis in a measuring cycle into a voltage at the sensor electrodes. To obtain final measurement values for the acceleration for each axis, a dichotomy algorithm is first of all used in the logic unit for a certain number of measuring cycles, prior to ending with oversampling steps. With this dichotomy algorithm, the measurement always starts, during each conversion, at half the measurement range, in particular at $V_{REG}/2$. If an error occurs during this first measurement with a large change step in the logic unit, the final value at the end of all the measuring cycles will inevitably be erroneous, which is a drawback.

SUMMARY OF THE INVENTION

It is thus an object of the invention to overcome the aforementioned drawbacks of the prior art by providing a method of measuring a physical parameter by means of an electronic interface circuit connected to a capacitive sensor, which can quickly supply precise output signals without any errors while also removing any voltage offset.

The invention therefore concerns a method of measuring a physical parameter by means of an electronic interface circuit connected to a capacitive sensor, which includes at least two differential connected capacitors whose a common electrode is capable of moving relative to each fixed electrode of the two capacitors to alter the capacitive value of each capacitor when the physical parameter is being measured, said electronic circuit including a charge transfer amplifier, which is connected to the common electrode via a switching unit, a logic unit connected to the amplifier output for digital processing of the data supplied by the amplifier and for supplying digital measuring signals, and a digital-analogue converter capable of supplying a measurement voltage to the electrodes via the switching unit, the measurement voltage being defined on the basis of a binary word conversion defining at least one of the digital measuring signals, the method including several successive measuring cycles for a measurement conversion, wherein each successive measuring cycle comprises the steps of:

a) biasing the electrodes of the capacitors via the switching unit with a measuring voltage supplied by the digital-analogue converter on the basis of a first digital measuring signal from a preceding cycle or a first initial binary word supplied by the logic unit, the first digital signal depending on a first biasing of the fixed electrodes of the capacitors, b) connecting the fixed electrodes of the capacitors via the switching unit respectively each to the terminals of a supply voltage source for a first biasing of the fixed electrodes, c) biasing the electrodes of the capacitors via the switching unit with a measuring voltage supplied by the digital-analogue converter on the basis of a second digital measuring signal from a preceding cycle or a second initial binary word supplied by the logic unit, the second digital signal depending on a second biasing which is the reverse of the first biasing of the fixed electrodes of the capacitors, d) connecting the fixed electrodes of the capacitors via the switching unit respectively each to the terminals of a supply voltage source for a second biasing of the fixed electrodes, which is the inverse of the first biasing, wherein the method starts each conversion with measuring cycles, in which the first and second digital signals are adapted in the logic unit, by the addition or subtraction of a first step value equal to 1 or 2, on the basis of information as to the high output state or low output state of the charge transfer amplifier in each measuring cycle, wherein a decision counter of the logic unit counts or counts down the successive output states of the charge transfer amplifier in each measuring cycle, so as to adapt the first and second digital signals by the addition or subtraction of a second determined step value higher than 2, if the number of identical states successively counted or counted down at the output of the charger transfer amplifier exceeds a predetermined threshold, and wherein the detection of a change of sign in the count or countdown of the decision counter in the measuring cycles to the second step value, is checked in the logic unit so as to re-adapt the step size to the first step value in the event of a change of sign, until the end of the measurement conversion.

Particular steps of the measuring method are defined in the dependent claims 2 to 7.

One advantage of the measuring method lies in the fact that at least one digital output signal for a physical parameter measurement can be quickly supplied at the electronic circuit output without any errors. The measuring method provides a good compromise between rapid changes for example of an acceleration, and the supply of measuring signals, and the reduction in noise by means of small adapting steps, in particular at the end of each conversion.

To achieve this, the measuring method advantageously uses a self-adapting algorithm to detect large acceleration changes particularly between two successive conversions or within the same conversion. After a certain number of small step measuring cycles, a decision counter determines whether there is a continual increase or a continual decrease in the digital signals in order to adapt the size of each step of the subsequent measuring cycles. Adaptation of each step to a large digital value occurs as soon as a predetermined counting threshold of a decision counter is exceeded. As soon as the decision counter determines a change of sign in the measuring cycles with a large step value, the step size of each measuring cycle is re-adapted to small steps to reduce noise.

Another advantage of the measuring method lies in the fact that, at the end of each conversion, the last digital signal stored in each corresponding register can be used again in order to start a subsequent measurement conversion. To start a new conversion, it is also possible to use the final mean of the successive digital signals stored in a corresponding register in at least a final part of successive measuring cycles with small adapting steps. It is possible to select the last digital value stored for each digital signal or the mean of the digital signals of the final part of measuring cycles on the basis of a count by a decision counter.

Advantageously, taking the preceding digital value from the positive biasing register and from the negative biasing register for each measurement axis, means that the preceding conversion variation and therefore also the preceding offset can be stored. If there are no large acceleration changes from one conversion to the next conversion, it is therefore possible to use only measuring cycles with small steps. During an abrupt acceleration transition, adaptation of each successive measuring cycle step size may occur in a measurement conversion after a certain number of small step cycles. Each step size is re-adapted to a small step size once a change of sign is detected via the decision counter. The mean of the digital signals stored since the change to small step measuring cycles is calculated in order to store the final digital value for each measurement axis and each biasing. This final digital value of each register is thus used to start a new measurement conversion.

The invention therefore also concerns an electronic interface circuit for a capacitive sensor, which includes a pair of differential connected capacitors for implementing the measuring method, the electronic circuit including a charge transfer amplifier connected to the common electrode via a switching unit, a logic unit connected to the amplifier output for digital processing of the data supplied by the amplifier and for supplying first and second digital measuring signals, dependent respectively on a first biasing of the fixed electrodes of the capacitors and a second biasing which is the reverse of the first biasing, and a digital-analogue converter capable of supplying a measuring voltage to the electrodes via the switching unit, the measuring voltage being defined on the basis of a binary word conversion relating to the first digital signal stored in a first register of the logic unit or the second digital measuring signal stored in a second register of the logic unit, wherein the logic unit includes a mean calculation element connected to the registers, the element being intended to calculate the mean of the first successive stored digital signals and the mean of the second successive stored digital signals in at least a final part of the measuring cycles of a conversion with adaptation to a first step value in each measuring cycle, and a decision counter capable of counting or counting down successive output states of the charge transfer amplifier in each measuring cycle, to adapt the first and second digital signals by the addition or subtraction of a second determined step value greater than 2 if the number of successive identical states counted or counted down at the output of the charge transfer amplifier exceeds a predetermined threshold, the decision counter being also intended to control the selection of the last digital value of the first digital signal and the second digital signal, if the measurement conversion ends in a measuring cycle with adaptation of each digital measuring signal to the second step value.

Specific embodiments of the electronic circuit are defined in the dependent claims 9 to 11.

One advantage of the physical sensor electronic interface circuit lies in the fact that it can quickly provide stabilised digital measuring signals at output owing to digital processing immediately after the charge transfer amplifier. These digital measuring signals are processed in the logic unit. A self-adapting algorithm stored in the logic unit can adapt the size of the measurement cycle adapting steps to supply adapted digital signals as a result of detection of a large change in the physical parameter measured during a measurement conversion. Two digital signals depending on positive biasing or first biasing, and on negative biasing or second biasing of the fixed electrodes of the pair of capacitors are generally supplied in the logic unit. By combining the digital signals this enables any voltage offset to be removed from the electronic circuit components.

Another advantage of the electronic interface circuit for a physical sensor lies in the fact that it can provide digital signals for each axis of a tri-axis sensor. A single amplifier, a logic unit and a single digital-analogue converter are thus provided for measuring the physical parameter on the three axes. This limits redundancy in the electronic circuit.

BRIEF DESCRIPTION OF THE DRAWINGS

The objects, advantages and features of the method of measuring a physical parameter and the electronic interface circuit for a capacitive sensor for implementing the same will appear more clearly in the following description with reference to the drawings, in which:

FIGS. 3a and 3b show comparative conversion time diagrams on a measurement axis, on the one hand, without applying the self-adapting algorithm, and on the other hand, applying the self-adapting algorithm of the measuring method according to the invention, during an abrupt change in the physical parameter to be measured and starting from the digital value of a preceding conversion.

DETAILED DESCRIPTION OF THE INVENTION

Since various components of the sensor electronic interface circuit with differential capacitors are well known in this technical field, they will not all be explained in detail in the following description. Emphasis is mainly placed on the method of measuring the physical parameter by means of an electronic circuit which supplies digital measuring signals at output.

Figure 1:
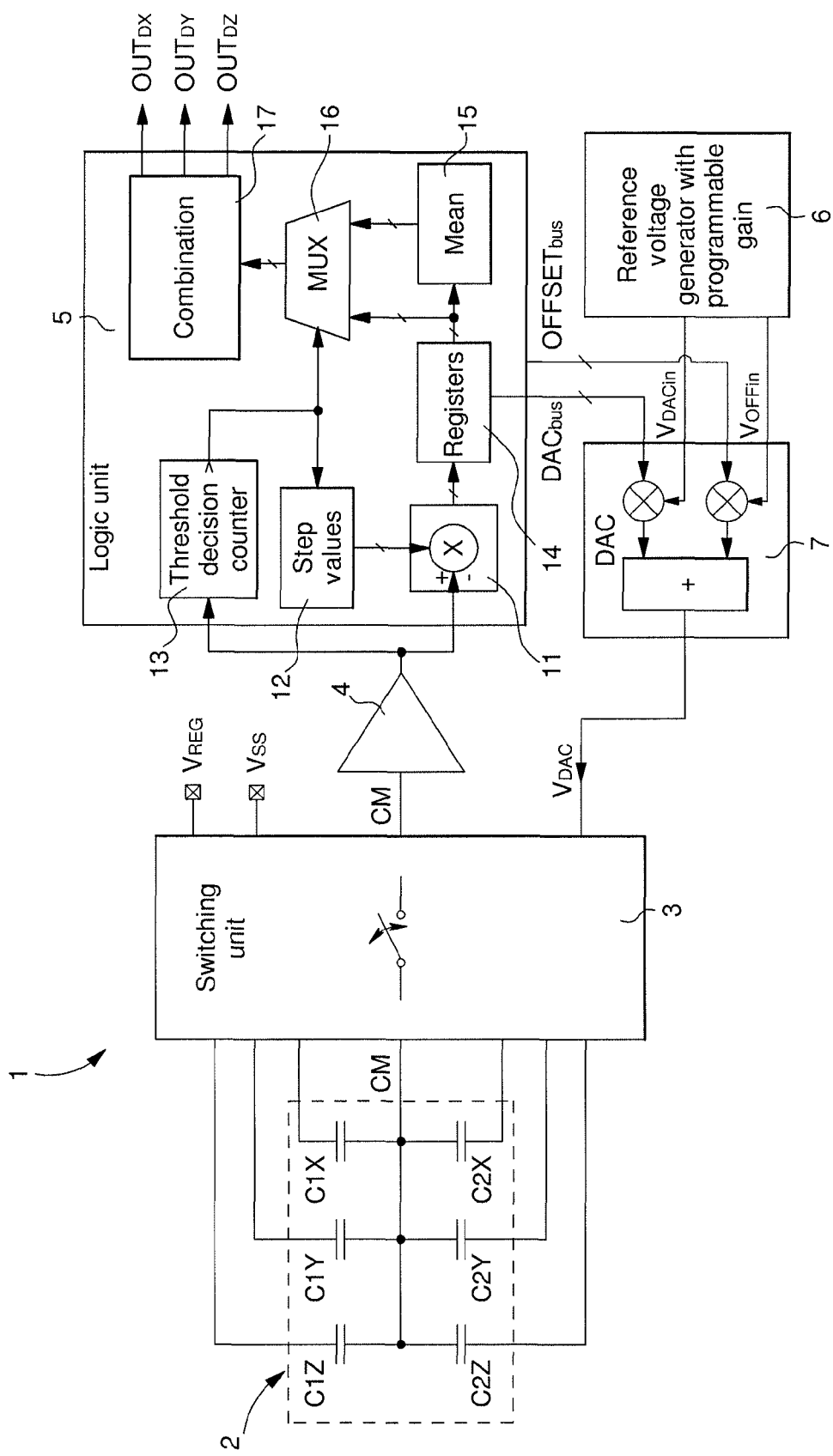
FIG. 1 shows a simplified view of an electronic interface circuit connected to a capacitive sensor for implementing the method of measuring a physical parameter according to the invention.

FIG. 1 shows a simplified diagram of the various components of electronic interface circuit 1 for a capacitive sensor 2 according to the invention. In this embodiment, a tri-axis capacitive MEMS sensor 2 with a single mass is connected to electronic circuit 1, although it is entirely possible to envisage connecting a tri-axis sensor with three moving masses or a single axis sensor. This capacitive sensor is thus formed of three pairs of capacitors C1X, C2X, C1Y, C2Y, C1Z and C2Z. The two capacitors of each pair are differential connected. A common electrode CM of the pairs of capacitors can move under the action of a force between two fixed electrodes of each pair of capacitors to make a measurement taking account of the three axes X, Y and Z.

Electronic circuit 1 can supply digital measuring signals for each axis, which relate to a physical parameter, such as an acceleration, angular speed, pressure or force, as a function of the movement of the common moving electrode. In the case of an acceleration measurement, the electronic circuit can be configured to supply digital measuring signals between minimum and maximum acceleration values. One may choose, for example, to configure the electronic circuit to supply digital measuring signals within the acceleration range of −2 g to +2 g. A voltage variation of around 3 to 20 mV may be allowed for 1 g of acceleration.

Moving common electrode CM may form part of the armature of a sensor resiliently held in a central position at rest between the two fixed electrodes of each pair of capacitors C1X, C2X, C1Y, C2Y, C1Z and C2Z. Electronic circuit 1 may be powered by a continuous supply voltage source (not shown). This supply voltage source supplies a regulated high voltage $V_{REG}$ at a first terminal and a low voltage $V_{SS}$ at a second terminal. The low voltage can be defined at 0 V, whereas the regulated high voltage can be set at 1.65 V for example. The fixed electrode of each capacitor can be biased in a measuring cycle phase, either at high voltage $V_{REG}$ or at low voltage $V_{SS}$ in an operating mode of the electronic circuit. Consequently, since the two capacitors C1X, C2X, C1Y, C2Y, C1Z and C2Z of each pair have an equal capacitive value when sensor 2 is at rest, the voltage across common electrode CM is preferably equal at rest to an intermediate voltage $V_{REG}/2$ between regulated voltage $V_{REG}$ and low voltage $V_{SS}$ at 0 V.

The digital measuring signals supplied by electronic circuit 1 are proportional for two capacitors C1 and C2 at (C1−C2)/(C1+C2). Once the digital measuring signals have stabilised at a final physical parameter measurement at the end of each conversion, any charge flow across the two capacitors of each pair is cancelled out. Thus the object of the electronic circuit consists in finding a voltage to apply across each fixed electrode in a charge equalising phase, on the basis of a preceding digital signal, which satisfies $(V_{REG}-V_{DAC}) \cdot C1 = (V_{DAC}-V_{SS}) \cdot C2$. This is achieved when $V_{DAC} = (V_{REG}/2) \cdot (1+(C1-C2)/(C1+C2))$.

Electronic circuit 1 includes a comparator type charge transfer amplifier 4, which is directly connected to moving electrode CM of the capacitors via a switching unit 3. Switching unit 3 receives voltages $V_{REG}$, $V_{SS}$ and $V_{DAC}$ to be applied to the sensor electrodes in accordance with the measuring cycle phases. Regulated voltage $V_{REG}$ and low voltage $V_{SS}$ are applied to the fixed electrodes, whereas voltage $V_{DAC}$, from a digital-analogue converter 7 in inverse feedback, is applied to all the electrodes. Each measuring cycle alternates between a phase where all the electrodes receive a voltage $V_{DAC}$ from a preceding measurement and a phase of biasing the fixed electrodes between $V_{REG}$ and $V_{SS}$.

To understand how the voltages are applied to the electrodes during each measuring cycle and for the three measurement axes, reference is made to EP Patent Application No. 2 343 507 A1 which is incorporated herein by reference. In this regard, all the voltages are explained with reference to FIG. 2 of that patent application, and described in paragraphs 40 to 48. In each first measuring half cycle, there is successive positive biasing of the fixed electrodes for each measurement axis, alternately with voltage $V_{DAC}$ supplied to all the electrodes and which relates to a preceding digital measuring signal of the positive biasing for each measurement axis. Positive biasing may be the first biasing of the fixed electrodes. In each second measuring half cycle, there is successive negative biasing of the fixed electrodes, alternately with voltage $V_{DAC}$ supplied to all the electrodes and which relates to a previous digital measuring signal of the negative biasing for each measurement axis. Negative biasing may be the second biasing. The positive biasing between $V_{REG}$ and $V_{SS}$ is the inverse of the negative biasing.

Each acceleration measuring cycle has 12 phases, comprising 3 positive biasing phases for each measuring axis, and 3 negative biasing phases, for a tri-axis sensor, whereas simply 4 phases are sufficient for a single axis sensor. Further, several successive measurement cycles are necessary to obtain the final digital measuring values for each axis of each conversion as explained below. For each conversion, 16, 32, 40 or 64 successive measurement cycles may, for example, be carried out. However, unlike the succession of measurement cycles presented in the above patent application, every conversion of the measuring method according to the invention does not start in the middle of the measurement range at $V_{REG}/2$. Each conversion starts by taking account of the preceding digital value stored from a previous conversion respectively for each measurement axis and for positive biasing and for negative biasing.

Comparator amplifier 4 is of very simple design of the type disclosed in the article entitled "A 1 mV MOS Comparator" in the journal IEEE, J. Solid-State Circuits, vol. SC-13. pp. 294-298 of June 1978. This comparator amplifier 4 generally includes a capacitor at input connected to common electrode CM, followed by amplifier stages for supplying an all-or-nothing digital signal at output. This charge transfer amplifier has a very high gain. The amplifier output signal is at the "1" state close to regulated voltage $V_{REG}$ when the voltage across moving electrode CM increases via the accumulation of positive charges in the measuring cycles. However, the amplifier output signal changes to the "0" state close to low voltage $V_{SS}$ when the voltage across moving electrode CM decreases via the accumulation of negative charges in the measuring cycles.

Electronic circuit 1 also includes a logic unit 5, which includes storage means, which store, in particular, various configuration parameters, and mainly the measuring algorithm of the method of the invention. Logic unit 5 of the electronic circuit further includes a processor (not shown) which is clocked by a conventional clock signal, so as to control performance of all the necessary steps of the physical parameter measuring method, particularly for an acceleration.

Logic unit 5 further includes at least one counter 13 connected to the processor, and several registers 14 for storing digital signals in the form of binary measuring words for each measurement axis. There are two registers per measurement axis. Thus for measuring an acceleration with a tri-axis sensor, logic unit 5 has six registers for the three measurement axes. For each axis, a first register receives a first digital measuring signal from a defined positive biasing (pol at "0") of the fixed electrodes of the corresponding pair of capacitors, whereas a second register receives a second digital measuring signal from a defined negative biasing (pol at "1") of the fixed electrodes of the corresponding pair of capacitors. Negative biasing is simply a reverse biasing of the positive biasing.

During each measuring cycle, the first digital signal and the second digital signal for each axis stored in a corresponding register, are incremented or decremented by a certain digital value according to a determined programmed step. To achieve this, logic unit 5 includes a multiplication element 11, which receives the output signal from comparator amplifier 4, and a digital value of an element 12 supplying a step value. If the output of comparator amplifier 4 is in the high state "1", this means an increase in voltage across moving electrode CM. In these conditions, the multiplication element 11 multiplies the digital step value by +1 in order to add the digital step value to the preceding digital signal stored in the corresponding register 14. Conversely, if the output of comparator amplifier 4 is in the low state "0", this means a decrease in voltage across moving electrode CM. In these conditions, multiplication element 11 multiplies the digital step value by −1 in order to subtract the digital step value from the preceding digital signal stored in the corresponding register 14.

At the beginning of each conversion, the initial digital signal for each axis which results from positive biasing and negative biasing corresponds to the digital signal stored in a corresponding register 14 from a preceding measurement conversion. For the first measuring cycles, logic unit 5 is configured to control step value supply element 12 so that a small or first step value is added to or subtracted from the digital signal of a corresponding register 14 in each measuring cycle according to the output level of comparator amplifier 4. This small digital step value may advantageously be chosen to be 1 or 2 according to the noise to be taken into account.

After having been reset to zero at the start of each measurement conversion, decision counter 13 counts or counts down according to the state of the output signal from comparator amplifier 4 in each measuring cycle. If there is only a continual increase or continual decrease of counter 13 in each first successive measuring cycle of the conversion, logic unit 5 controls element 12 to adapt the digital value of each step to a larger step value or second step value. This adaptation occurs as soon as the number of "1"s or "0"s counted in succession exceeds a predetermined threshold, for example after 8, 16, 32 or another number of successive measuring cycles. For example, if after 8 successive measuring cycles, there is only a continual increase or a continual decrease in counter 13, the value of each step to be added to or subtracted from a preceding digital signal of a corresponding register is increased. This large or second step value may preferably be programmed at a value equal to 8, but may also be set at another value, such as 16, 32, 64 or another large value on a scale from 0 to 1023 for each 10-bit binary word. This large step value may also be variable, in particular gradually variable above the value of 2 or from one conversion to another. Each binary word may be in more than 10 bits or fewer bits according to the intended application of the electronic circuit with the capacitive sensor.

Once the step value has been adapted to a large value, this large step value is added to or subtracted from a preceding digital signal of a corresponding register 14 in each successive measuring cycle. As soon as a change of sign is detected in counter 13 in the successive measuring cycles with a large step value, the step value is again adapted to a small value by logic unit 5 until the end of the measurement conversion. This is carried out for the 6 registers in succession. Thus the step value to be added or subtracted is self-adapted to take account of a large change in the physical parameter, such as an acceleration, from one conversion to the next conversion, or within the same measurement conversion.

If there is a large acceleration change within the same conversion, it may be necessary to adapt the step value in part of the final measuring cycles of said conversion. This means that re-adaptation to a small value cannot occur in the conversion and only the final value of each digital signal is taken into account for a subsequent conversion.

The duration of each measurement conversion for the three measurement axes may be less than 1,500 µs if each phase has a duration of around 2 µs or less. Of course, this duration also depends on the number of samples taken for each axis and each positive or negative biasing. If only 32 samples are taken in each measurement conversion, the duration of each conversion may be less than 1 ms.

For each measuring cycle, in which 16, 32, 40 or 64 successive measuring cycles may be provided, it is possible to calculate the mean of all the successive digital signals stored in a corresponding register once logic unit 5 has re-adapted the step value to a small value. If no step value adaptation has occurred during the entire measurement conversion, if there are no large changes from one conversion to a subsequent conversion, it is possible to calculate the mean of a large final part or of all the successive stored digital signals. At least 8, 10 or 12 samples may in principle be necessary to calculate the mean in successive measuring cycles with small steps.

The mean of the successive digital signals is calculated via a mean calculation element 15 connected to registers 14. A particular memory connected to mean element 15 can store all the successive digital signals of a corresponding register. The mean of the results of the successive measuring cycles with small steps may of course be calculated, except in the case where there is an abrupt acceleration change within the same conversion and in a final part of the measuring cycles. Following this abrupt change, the step value is adapted to a large step value and a continual decrease or increase in each measuring cycle with a large step value may occur up until the end of the conversion. In these conditions, with a large change in the physical parameter, only the last digital signal for each axis and each biasing is stored in the memory to start a new measurement conversion.

With this self-adapting algorithm of the measuring method, a change of sign in decision counter 13 is generally detected after being adapted to supply a large step value in each measuring cycle. It is therefore possible to calculate a mean on the samples stored in each measuring cycle after re-adaptation to a small step value, until the end of the conversion.

If the number counted by the decision counter does not exceed the predetermined threshold, multiplexer 16 supplies at output the mean of the various digital signals stored in the final part of successive measuring cycles, which is supplied by mean element 15. This mean may be considered the integration of the successively stored digital signals. At the end of each conversion, by combining or adding two registers per measurement axis in a combination element 17 connected to multiplexer 16, logic unit 5 supplies a digital output signal $OUT_{DX}$, $OUT_{DY}$, $OUT_{DZ}$. Any offset voltage has been removed from these combined output signals for each axis.

It is to be noted that at the end of each conversion, either the last digital signal of each register, or the stored mean of various digital signals in at least a final part of the measuring cycles, is used for a new conversion. This advantageously means that advantage can be taken of preceding value variations in previous conversions while storing the preceding offset. In these conditions, adaptation to a large step value is no longer necessarily required for the measuring cycles for a subsequent conversion without any significant change in the physical parameter to be measured. With measuring cycles adding or subtracting a small step value, this means that the effects of noise can advantageously be reduced.

It is also to be noted that following adaptation to a large step value for measuring cycles in the measurement conversion, this large step value can be gradually decreased or increased to allow more or less rapid detection of a change of sign in the counter. An optimum large step size can be determined by taking account of the ratio between the noise and square root of the bandpass. Noise also increases with large step values involving a large bandpass. Thus a good compromise has to be found between the adaptation of measuring cycles to a large step value so as to rapidly reach the target acceleration value to be measured, and the noise generated. In principle, with a large step value set at 8, an optimum was determined but may nonetheless vary from one conversion to the next.

Each digital measuring signal or binary word DACbus stored in registers 14 is supplied in succession in each measuring cycle to a DAC digital-analogue converter 7 so as to convert each binary word DACbus into an output voltage $V_{DAC}$. As explained above this DAC output voltage allows all of capacitors C1X, C2X, C1Y, C2Y, C1Z, C2Z and CM to be discharged in one of the measuring cycle phases to a voltage value which depends on the binary word DACbus of a particular axis. Binary word DACbus is multiplied in a first multiplier in digital-analogue converter 7 by a reference voltage $V_{DACin}$, which comes from a reference voltage generator with a programmable gain 6. This reference voltage can be supplied by means of a resistive divider connected between regulated voltage $V_{REG}$ and earth $V_{SS}$.

Logic unit 5 also supplies a binary adjusting word OFFSETbus (10 bits) for an offset voltage relating to the MEMS sensor at input. This binary adjusting word OFFSETbus is multiplied in a second multiplier in digital-converter 7 with an adjusting voltage $V_{OFFin}$, which comes from programmable gain reference voltage generator 6. This adjusting voltage $V_{OFFin}$ can also be obtained by means of a resistive divider connected between regulated voltage $V_{REG}$ and earth $V_{SS}$. The output voltages of the two multipliers of converter 7 are then added so that the digital-analogue converter supplies voltage $V_{DAC}$ at output. The voltage offset linked to the MEMS sensor does not depend on the biasing applied to the fixed electrodes of the capacitor pairs. A preliminary calibrating step for correcting this MEMS sensor voltage offset can be performed once and for all before the physical parameter is measured by electronic circuit 1.

Since binary words DACbus and OFFSETbus may be, for example, in 10 bits from 0 to 1023, it is possible to express output voltage $V_{DAC}$ from a positive biasing (polarity "0") of the fixed electrodes on the one hand and from a negative biasing (polarity "1") of the fixed electrodes on the other hand. However, each binary word may also be defined in more than 10 bits or fewer bits according to the desired application of the electronic circuit with the capacitive sensor. These two equations eq(0) and eq(1) of the two voltages $V_{DAC}$ are expressed as follows:

$$V_{DAC}(0) = V_{REG}/2 + V_{DACoffset} + (DACbus(0) - 512) \cdot K_{DAC} \cdot V_{REG} + (OFFSETbus - 512) \cdot K_{OFF} \cdot V_{REG} \quad \text{eq(0):}$$

$$V_{DAC}(1) = V_{REG}/2 + V_{DACoffset} - (DACbus(1) - 512) \cdot K_{DAC} \cdot V_{REG} - (OFFSETbus - 512) \cdot K_{OFF} \cdot V_{REG} \quad \text{eq(1):}$$

$K_{DAC}$ is a factor that defines the system gain. This gain can be programmable for example by generating a voltage $V_{DACin}$ which comes from a resistive divider of the reference voltage generator 6. $K_{OFF}$ is a factor which defines the gain of the adjusting circuitry of the MEMS sensor voltage offset. This gain can be adapted in accordance with the desired adjusting range for example by generating a voltage $V_{OFFin}$ which comes from another resistive divider of the reference voltage generator 6. DACbus(0) defines the 10-bit binary word which comes from a first register of logic unit 5, which is applied to DAC converter 7 during the positive biasing phases. This binary word is defined from 0 to 1023. DACbus (1) defines the 10 bit binary word which comes from a second register of logic unit 5, which is applied to DAC converter 7 during the negative biasing phases. This binary word is defined from 0 to 1023. OFFSETbus defines the 10-bit binary adjusting word which is applied to DAC converter 7 to correct the voltage offset linked to the MEMS sensor. $V_{DACoffset}$ represents the stray voltage offset of DAC converter 7 which it is desired to remove. This stray voltage offset covers any voltage offset linked to the electronic circuit (amplifier, converter, . . . ), and may also represent the flicker noise frequency.

It is also to be noted that DACbus(0) may be different from DACbus(1) if an acceleration is being measured, since these binary words depend on the state of biasing applied to the fixed electrodes. However, OFFSETbus does not depend in any way on the biasing applied to the fixed electrodes. Thus OFFSETbus is selected permanently after the preliminary step of calibrating the MEMS sensor linked to the electronic circuit as indicated above. This binary adjusting word can be stored in the storage means of logic unit 5. If the MEMS sensor needs a voltage variation $V_{MEMS}$ around $V_{REG}/2$ in order to balance the charges, equations eq(0) and eq(1) take the following form:

$$V_{REG}/2 + V_{MEMS} = V_{REG}/2 + V_{DACoffset} + (DACbus(0) - 512) \cdot K_{DAC} \cdot V_{REG} + (OFFSETbus - 512) \cdot K_{OFF} \cdot V_{REG} \quad \text{eq(0):}$$

$$V_{REG}/2 + V_{MEMS} = V_{REG}/2 + V_{DACoffset} - (DACbus(1) - 512) \cdot K_{DAC} \cdot V_{REG} - (OFFSETbus - 512) \cdot K_{OFF} \cdot V_{REG} \quad \text{eq(1):}$$

If capacitance C1X is greater than capacitance C2X for example, the charge balancing occurs at a higher voltage than $V_{REG}/2$ for the positive biasing and a lower voltage than $V_{REG}/2$ for a negative biasing. If these two equations eq(0) and eq(1) are subtracted, this gives the following equation eq(2):

$$2 \cdot V_{MEMS} = (DACbus(0) + DACbus(1) - 1024) \cdot K_{DAC} \cdot V_{REG} + 2 \cdot (OFFSETbus - 512) \cdot K_{OFF} \cdot V_{REG} \quad \text{eq(2):}$$

DACbus(0)+DACbus(1)−1024 is proportional to $V_{MEMS}$ which is also proportional to the acceleration. The term $V_{DACoffset}$ has disappeared from equation eq(2) which is the ultimate objective. The system gain thus depends on the choice of $K_{DAC}$. The MEMS sensor voltage offset can thus still be eliminated by proper selection of binary word OFFSETbus.

Figure 2:
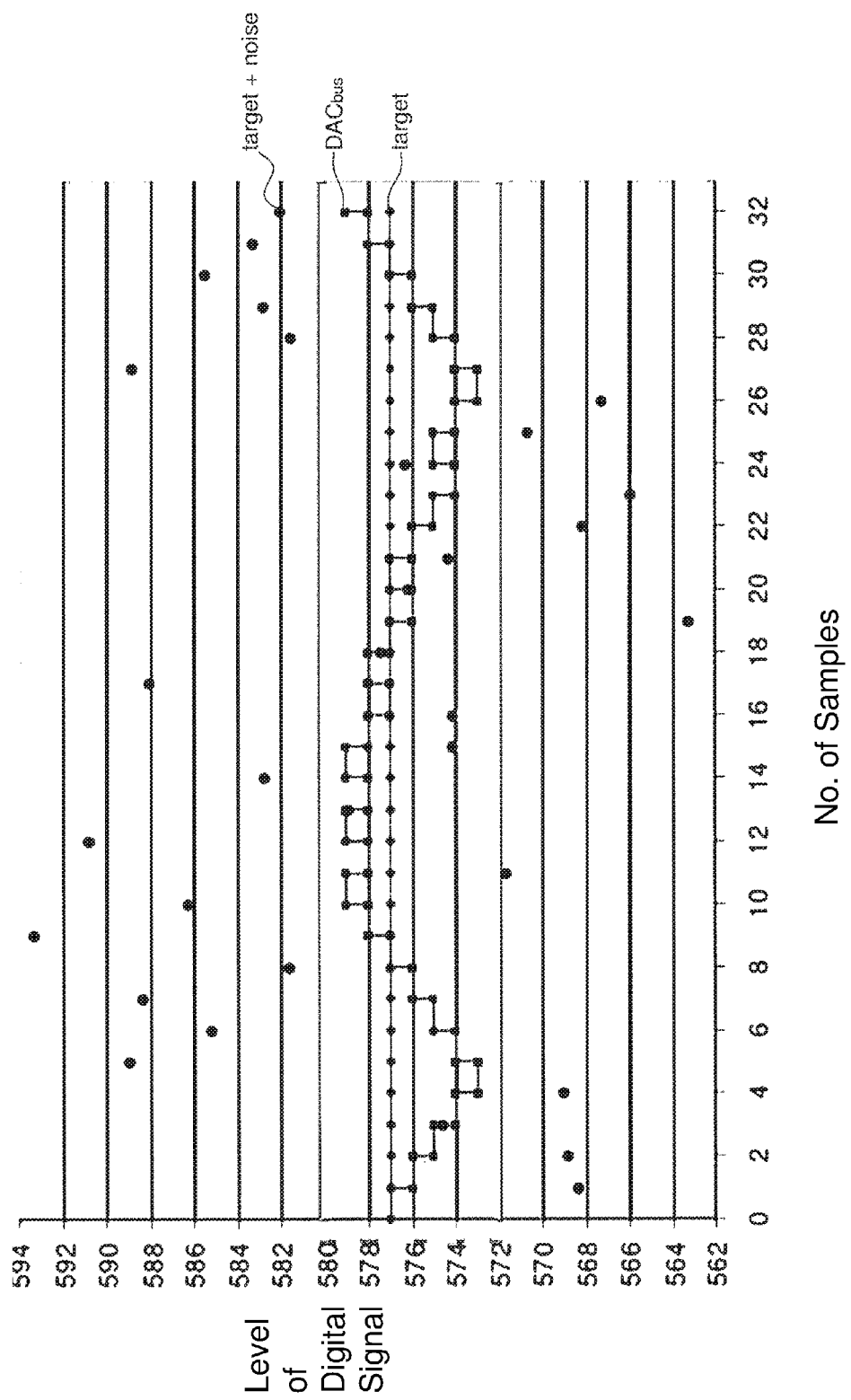
FIG. 2 shows a conversion time diagram for the measuring method according to the invention, on a measurement axis starting from the digital value of a preceding conversion, and in the case where there is no variation in the physical parameter to be measured.
Figure 3A:
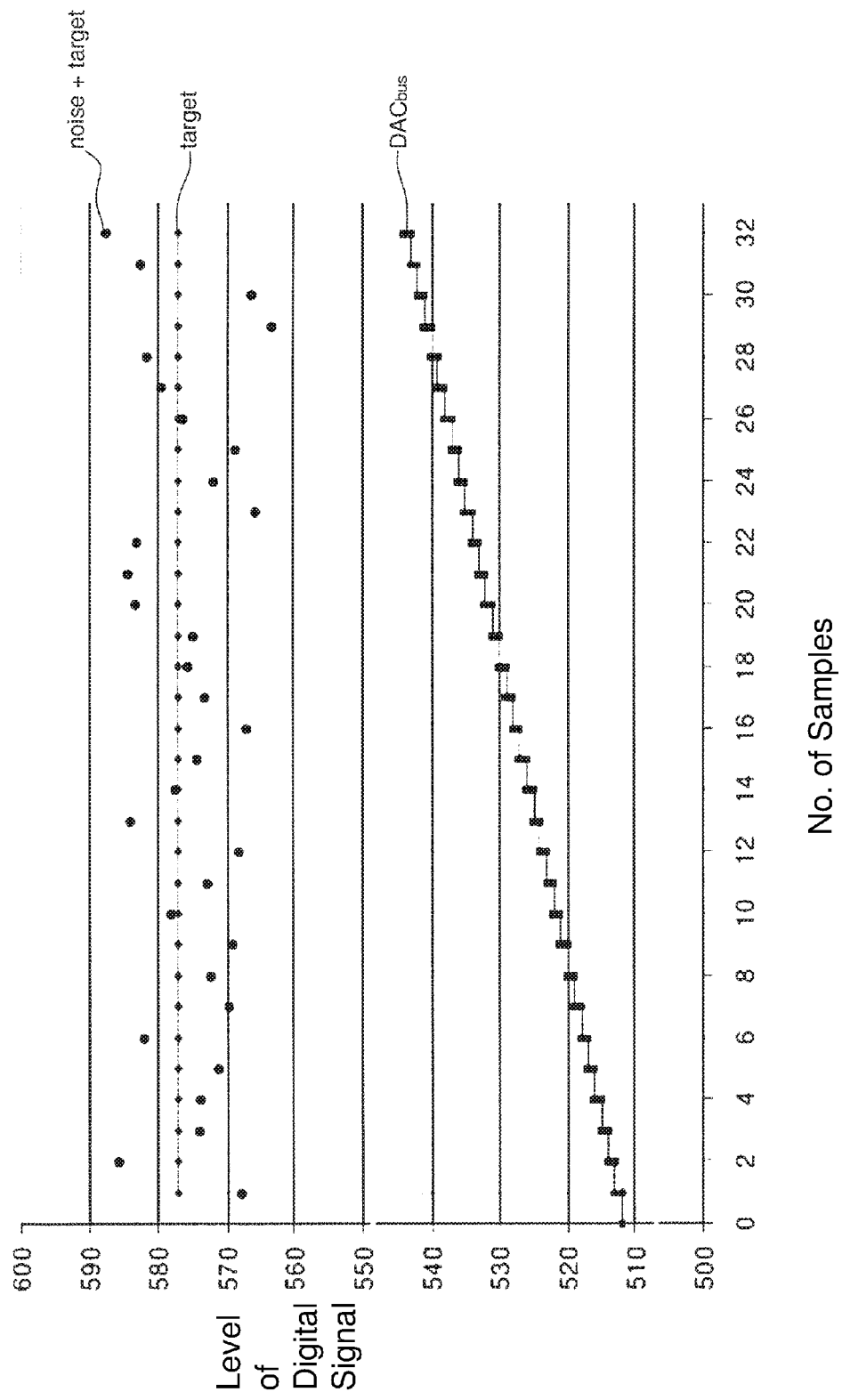

To better show the change in the digital signals in at least one measurement conversion, reference may be made to FIGS. 2, 3*a* and 3*b* relating to the measuring method according to the invention.

FIG. 2 shows a conversion time diagram of the measuring method of the invention, on a measurement axis for a single axis sensor, and one of the two biasings of the fixed electrodes of a pair of capacitors. However, identical graphs may also be shown for the case of a measurement by a tri-axis sensor. The x axis represents the number of samples taken for the measurement following one of the biasings. One sample is obtained for each digital signal in one measuring cycle. The y axis represents the level of each digital signal.

This time diagram represents the change in the digital signal without any great variation in the physical parameter to be measured compared to a preceding conversion. The conversion begins with the digital signal stored from the preceding conversion, for example with the binary word at 577. Each sample of the digital signal DACbus for the 32 conversion measuring cycles is represented by a rectangle, whereas the target value to be attained is represented by a series of rhombuses at 577. The decisions taken in the logic unit for the successive measuring cycles are affected by electronic noise, in particular from the digital-analogue converter and from the charge transfer amplifier. This noise added to the target value is also represented by a series of round dots for the conversion measuring cycles.

The influence of the noise level in adapting the preceding digital signal in each measuring cycle is seen in FIG. 2. If the preceding digital signal having generated the DAC voltage is smaller than the target level with noise, a small step value is added to the preceding binary signal for a successive measuring cycle. Otherwise, a small step value is subtracted from the preceding binary signal. The small step value may be equal to 1 LSB or 2 LSB depending on the application. Since there is no adaptation to a large step value in this case, it is possible to calculate the mean of the stored digital signals of at least a final part of the measuring cycles or of all the successively stored digital signals. Thus the digital value stored in the digital signal register at the end of the conversion corresponds to this mean and may be used for a subsequent conversion. The mean of the digital signals shown in FIG. 2 may be 576, which is close to the desired target value of 577.

FIGS. 3a and 3b show comparative time diagrams of a conversion on a measurement axis, on the one hand, without applying the self-adapting algorithm and on the other hand applying the self-adapting algorithm of the measuring method of the invention. In this case, there is an abrupt change in the physical parameter to be measured compared to a preceding conversion. The preceding stored digital signal from a preceding conversion is 512, and the target value to be attained is 577, representing an abrupt change in the physical parameter to be measured for this new conversion. Each sample of digital signal DACbus for the 32 measuring cycles of the conversion is represented by a rectangle, whereas the target value to be attained is represented by a series of rhombuses at 577. The noise added to the target value is also represented by a series of round dots for the conversion measuring cycles.

As can be seen in FIG. 3a, without the application of the self-adapting measuring cycle step value algorithm, a continual increase by a small step value is carried out in each successive measuring cycle. This continual increase in the digital signal occurs from the beginning to the end of the conversion towards the desired target value. The mean of the stored digital signal samples does not therefore provide the expected physical parameter measurement value. The mean of all the samples is 528. The same is true for the last value of the digital signal, which is even further from the desired target value. The last digital signal value is around 544, which is far from the target value of 577, but may be used as a digital value for a new conversion.

However, in FIG. 3b with application of the self-adapting measuring cycle step value algorithm, it is noted that the step value is adapted after for example 8 first measuring cycles. The digital start value of the conversion of 512 is increased by a small step value, i.e. a value equal to 1, in each first measuring cycle. Once the decision counter has counted the "1" state of continual increase in the digital signal 8 times in succession, the step value is adapted for the 9th measuring cycle. The step size is adapted for example to a value equal to 8. As FIG. 3b shows, a large step value increase in the digital signal is carried out in each successive cycle until there is a change of sign in the decision counter. This change of sign occurs in the 16th cycle, which means that the digital signal is close to the expected target value. Henceforth, a small step value re-adaptation is carried out for all the successive measuring cycles of the final part of the conversion. It is possible to calculate the mean of the stored digital samples of the digital signal from the 16th cycle to the 32nd final cycle in the logic unit. This mean may be stored in the corresponding digital signal register to act as the starting point for a subsequent conversion.

From the description that has just been given, multiple variants of the method of measuring a physical parameter and the electronic interface circuit for the capacitive sensor for implementing the same can be devised by those skilled in the art without departing from the scope of the invention defined by the claims. It is possible to envisage altering the duration of each phase in relation to the other, or the duration of each cycle during the physical parameter measuring operations, as well as the number of successive measuring cycles for each measurement conversion. The large step value in the measuring cycles can be increased or decreased gradually within the same conversion, or modified from one conversion to a subsequent conversion. The order of the positive and negative biasing can be altered in each measuring cycle. At least two additional phases of the electronic circuit function test can also be placed in each measuring cycle.

What is claimed is:

1. A method of measuring a physical parameter by means of an electronic interface circuit connected to a capacitive sensor, which includes at least two differential connected capacitors each of which has a common electrode that is capable of moving relative to a fixed electrode of each of the at least two differential connected capacitors, the fixed electrode of each of the at least two differential connected capacitors collectively referred to as fixed electrodes, to alter the capacitive value of each capacitor when the physical parameter is being measured, said electronic interface circuit including a charge transfer amplifier, having an amplifier output, which is connected to the common electrode via a switching unit, a logic unit connected to the charge transfer amplifier output for digital processing of data supplied by the charge transfer amplifier and for supplying digital measuring signals, and a digital-analogue converter capable of supplying a measurement voltage to the fixed electrodes via the switching unit, the measurement voltage being defined on the basis of a binary word conversion defining at least one of the digital measuring signals, the method including several successive measuring cycles for a measurement conversion, wherein each successive measuring cycle comprises the steps of:

a) biasing the fixed electrodes of the capacitors via the switching unit with a measuring voltage supplied by the digital-analogue converter on the basis of a first digital measuring signal from a preceding cycle or a first initial binary word supplied by the logic unit, the first digital measuring signal depending on a first biasing of the fixed electrodes of the capacitors, b) connecting the fixed electrodes of the capacitors via the switching unit respectively to each of the terminals of a supply voltage source for a first biasing of the fixed electrodes, c) biasing the fixed electrodes of the capacitors via the switching unit with a measuring voltage supplied by the digital-analogue converter on the basis of a second digital measuring signal from a preceding cycle or a second initial binary word supplied by the logic unit, the second digital measuring signal depending on a second biasing which is an inverse of the first biasing of the fixed electrodes of the capacitors, d) connecting the fixed electrodes of the capacitors via the switching unit respectively to each of to the terminals of a supply voltage source for the second biasing of the fixed electrodes, which is the inverse of the first biasing, wherein the method starts each measurement conversion with measuring cycles, in which the first digital measuring signal and the second digital measuring signal are adapted in the logic unit, by the addition or subtraction of a first step value equal to 1 or 2, on the basis of information as to a high output state or a low output state of the charge transfer amplifier in each measuring cycle, wherein a decision counter of the logic unit counts or counts down successive output states of the charge transfer amplifier in each measuring cycle, so as to adapt the first digital measuring signal and the second digital measuring signal by the addition or subtraction of a second determined step value higher than 2, if the number of identical states successively counted or counted down at an output of the charger transfer amplifier exceeds a predetermined threshold, and wherein a detection of a change of sign in a count or countdown of the decision counter in the measuring cycles to the second determined step value, is checked in the logic unit so as to re-adapt a step size to the first step value in the event of a change of sign, until the end of the measurement conversion.

2. The measuring method according to claim 1, wherein the logic unit includes a first register for storing the first digital measuring signal in 10 bits, and a second register for storing the second digital measuring signal in 10 bits, wherein each measurement conversion starts on the basis of a final digital value for each digital signal stored in the first register and the second register from a preceding conversion.

3. The measuring method according to claim 1, wherein a mean is calculated from the digital signals stored in succession in the logic unit in at least a final part of the successive measuring cycles of the measurement conversion, with adaptation of the first digital measuring signal and the second digital measuring signal by the addition or subtraction of the first step value in each measuring cycle, in order to store the mean of each digital signal in a corresponding register as a final digital value to be supplied to start a subsequent conversion.

4. The measuring method according to claim 1, wherein if the measurement conversion ends in a measuring cycle with adaptation of each digital measuring signal to the second determined step value, a last digital value stored for each digital signal at the end of the measurement conversion is selected as a final digital value to be supplied for a subsequent conversion.

5. The measuring method according to claim 1, wherein the capacitive sensor is of the tri-axis type with three pairs of differential connected capacitors with one common electrode per pair or for all the pairs and two fixed electrodes for each pair, and the logic unit of the electronic interface circuit is capable of supplying the first digital measuring signal and the second digital measuring signal for each measuring axis X, Y and Z, wherein the method includes 12 successive phases per measuring cycle, which consist in repeating steps a) and b) in succession during the first six phases for each axis X, Y, Z with the first digital measuring signal corresponding to a selected axis, and in repeating steps c) and d) in succession during the last six phases for each axis X, Y, Z with the second digital measuring signal corresponding to the selected axis, and wherein the decision counter counts or counts down for each measurement axis the successive output states of the charge transfer amplifier in each measuring cycle so as to adapt the first digital measuring signal and the second digital measuring signal of each axis by the addition or subtraction of the second determined step value which is higher than 2, if the number of successive output states of the charge transfer amplifier counted or counted down exceeds the predetermined threshold.

6. The measuring method according to claim 1, wherein 16, 32, 40 or 64 measuring cycles are carried out in each measurement conversion, wherein the first step value is equal to 1 and wherein the second determined step value is greater than or equal to 8.

7. The measuring method according to claim 6, wherein the second determined step value greater than or equal to 8 is variable within the same conversion or from one measurement conversion to another.

8. An electronic interface circuit for a capacitive sensor, which includes a pair of differential connected capacitors for implementing the measuring method according to claim 1, the electronic interface circuit including a charge transfer amplifier connected to the common electrode via a switching unit, a logic unit connected to the amplifier output for digital processing of data supplied by the charge transfer amplifier and for supplying the first digital measuring signal and the second digital measuring signal, dependent respectively on a first biasing of the fixed electrodes of the capacitors and a second biasing which is the inverse of the first biasing, and a digital-analogue converter capable of supplying a measuring voltage to the fixed electrodes via the switching unit, the measuring voltage being defined on the basis of a binary word conversion relating to the first digital measuring signal stored in a first register of the logic unit or the second digital measuring signal stored in a second register of the logic unit, wherein the logic unit includes a mean calculation element connected to the first register and the second register, the element being intended to calculate the mean of a first successive stored digital signals and the mean of a second successive stored digital signals in at least a final part of the measuring cycles of a conversion with adaptation to a first step value in each measuring cycle, and a decision counter capable of counting or counting down successive output states of the charge transfer amplifier in each measuring cycle, to adapt the first digital measuring signal and the second digital measuring signal by the addition or subtraction of a second determined step value greater than 2 if the number of successive identical states counted or counted down at the output of the charge transfer amplifier exceeds a predetermined threshold, the decision counter being also intended to control the selection of a last digital value of the first digital measuring signal and the second digital measuring signal, if the measurement conversion ends in a measuring cycle with adaptation of each digital measuring signal to the second determined step value.

9. The electronic interface circuit according to claim 8, as an interface for a tri-axis capacitive sensor, which includes three pairs of differential connected capacitors, the electronic interface circuit further comprising: a single charge transfer amplifier for measurement on the three measuring axes X, Y and Z of the capacitive sensor, the charge transfer amplifier being capable of supplying digital data to the logic unit, to allow the decision counter to carry out a count or countdown according to the output state of the charge transfer amplifier in each successive measuring cycle of a conversion, and wherein the logic unit supplies the first digital measuring signal and the second digital measuring signal for each measurement axis X, Y and Z.

10. The electronic interface circuit according to claim 9, wherein the logic unit includes six registers for storing the first digital measuring signal and the second digital measuring signal for each axis, each register being defined in 10 bits.

11. The electronic interface circuit according to claim 8, further comprising a multiplexer operated by a control signal from the decision counter, so as to supply at output either the last digital signal of each register, if the measurement conversion ends in a measuring cycle with adaptation of each digital measuring signal of the first digital measuring signal and the second digital measuring signal to the second determined step value, or the mean of the first and second successive stored digital signals of each axis in at least a final part of the measuring cycles of a conversion with adaptation to the first step value in each measuring cycle, and an element for combining the first digital measuring signals and the second digital measuring signals of each axis received from the multiplexer in order to supply digital output signals for each axis.

* * * * *